United States Patent
Lindner

(10) Patent No.: US 12,062,521 B2
(45) Date of Patent: Aug. 13, 2024

(54) METHOD FOR PREFIXING OF SUBSTRATES

(71) Applicant: EV GROUP E. THALLNER GMBH, St. Florian am Inn (AT)

(72) Inventor: Friedrich Paul Lindner, Scharding (AT)

(73) Assignee: EV GROUP E. THALLNER GMBH, St. Florian am Inn (AT)

(*) Notice: Subject to any disclaimer, the term of this patent is extended or adjusted under 35 U.S.C. 154(b) by 240 days.

(21) Appl. No.: 17/714,290

(22) Filed: Apr. 6, 2022

(65) Prior Publication Data

US 2022/0230849 A1 Jul. 21, 2022

Related U.S. Application Data

(60) Division of application No. 16/556,511, filed on Aug. 30, 2019, now Pat. No. 11,328,939, which is a continuation of application No. 16/294,235, filed on Mar. 6, 2019, now Pat. No. 10,438,822, which is a division of application No. 15/535,082, filed as
(Continued)

(51) Int. Cl.
*H01J 37/32* (2006.01)
*C23C 16/44* (2006.01)
*C23C 16/455* (2006.01)

(52) U.S. Cl.
CPC .... *H01J 37/32082* (2013.01); *C23C 16/4401* (2013.01); *C23C 16/45519* (2013.01); *C23C 16/45544* (2013.01); *C23C 16/45565* (2013.01); *H01J 37/32091* (2013.01); *H01J 37/3244* (2013.01); *H01J 2237/334* (2013.01)

(58) Field of Classification Search
CPC .......... C23C 16/4401; C23C 16/45519; C23C 16/45544; C23C 16/45565; H01J 2237/334; H01J 37/32082; H01J 37/32733; H01J 2237/32091; H01J 2237/3244; H01L 21/67069; B29C 65/00; B29C 65/006; B29C 65/02; B29C 65/16; B29C 66/452
USPC .......... 156/60, 153, 272, 2, 272.8, 285, 286, 156/290, 292, 349, 350, 362, 379.6, 156/379.8, 381, 382, 499, 538, 539, 556
See application file for complete search history.

(56) References Cited

U.S. PATENT DOCUMENTS

| | | |
|---|---|---|
| 5,686,226 A | 11/1997 | Groman et al. |
| 6,563,133 B1 | 5/2003 | Tong |
| 7,332,410 B2 | 2/2008 | Tong |

(Continued)

FOREIGN PATENT DOCUMENTS

| | | |
|---|---|---|
| CN | 101050066 A | 10/2007 |
| DE | 10 2005 042 754 A1 | 3/2007 |

(Continued)

OTHER PUBLICATIONS

U.S. Appl. No. 15/535,082, filed Jun. 12, 2017.
(Continued)

*Primary Examiner* — Philip C Tucker
*Assistant Examiner* — Brian R Slawski
(74) *Attorney, Agent, or Firm* — KUSNER & JAFFE

(57) ABSTRACT

A method and a device for prefixing substrates, whereby at least one substrate surface of the substrates is amorphized in at least one surface area, characterized in that the substrates are aligned and then make contact and are prefixed on the amorphized surface areas.

3 Claims, 5 Drawing Sheets

Related U.S. Application Data application No. PCT/EP2014/079119 on Dec. 23, 2014, now Pat. No. 10,340,161.

(56) References Cited

U.S. PATENT DOCUMENTS

| | | |
|---|---|---|
| 8,640,548 B2 | 2/2014 | Wimplinger |
| 8,778,121 B2 | 7/2014 | Tuennermann et al. |
| 9,194,700 B2 | 11/2015 | Kast et al. |
| 9,601,350 B2 | 3/2017 | Suga et al. |
| 9,613,840 B2 | 4/2017 | Wagenleitner |
| 9,640,510 B2 | 5/2017 | Rebhan |
| 10,438,822 B2 | 10/2019 | Lindner |
| 2006/0132544 A1 | 6/2006 | Corley, Jr. et al. |
| 2008/0041517 A1 | 2/2008 | Moriceau et al. |
| 2010/0304151 A1 | 12/2010 | Tuennermann et al. |
| 2013/0187293 A1* | 7/2013 | Sakai ............... H01L 21/67069 250/492.1 |
| 2014/0154867 A1 | 6/2014 | Martinschitz et al. |
| 2016/0020136 A1 | 1/2016 | Thallner et al. |
| 2017/0069483 A1 | 3/2017 | Razek |
| 2017/0098572 A1 | 4/2017 | Wimplinger |
| 2017/0345690 A1 | 11/2017 | Lindner |

FOREIGN PATENT DOCUMENTS

| | | |
|---|---|---|
| DE | 10 2007 008 540 A1 | 8/2008 |
| EP | 2 463 892 B1 | 4/2013 |
| EP | 2 672 509 A1 | 12/2013 |
| JP | 2004-337928 A | 12/2004 |
| JP | 2006-073780 A | 3/2006 |
| WO | WO-2012/028166 A1 | 3/2012 |
| WO | WO-2013/023708 A1 | 2/2013 |
| WO | WO-2013/029656 A1 | 3/2013 |
| WO | WO-2014/154272 A1 | 10/2014 |
| WO | WO-2015/000527 A1 | 1/2015 |
| WO | WO-2015/149846 A1 | 10/2015 |
| WO | WO-2015/197112 A1 | 12/2015 |

OTHER PUBLICATIONS

U.S. Appl. No. 16/294,235, filed Mar. 6, 2019.
U.S. Appl. No. 16/556,511, filed Aug. 30, 2019.
International Search Report from corresponding International Patent Application No. PCT/EP2014/079110, dated Jul. 16, 2015.
Search Report issued in related Singapore Application No. 10201903094R dated Nov. 4, 2022.
Written Opinion issued in related Singapore Application No. 10201903094R dated Nov. 8, 2022.

* cited by examiner

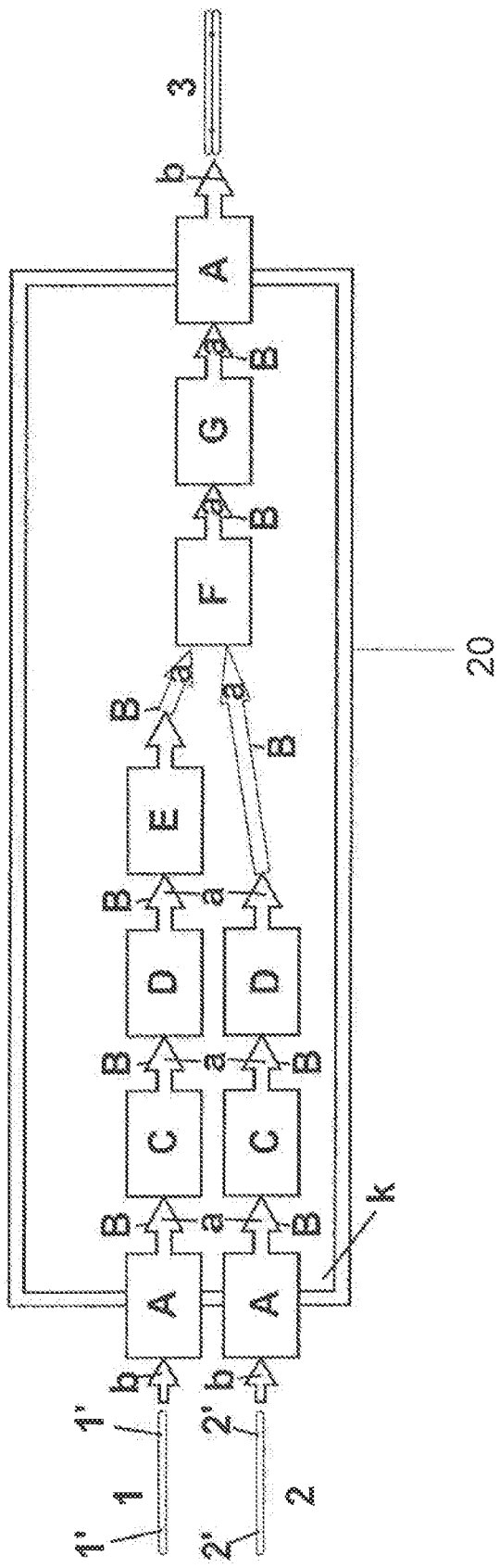

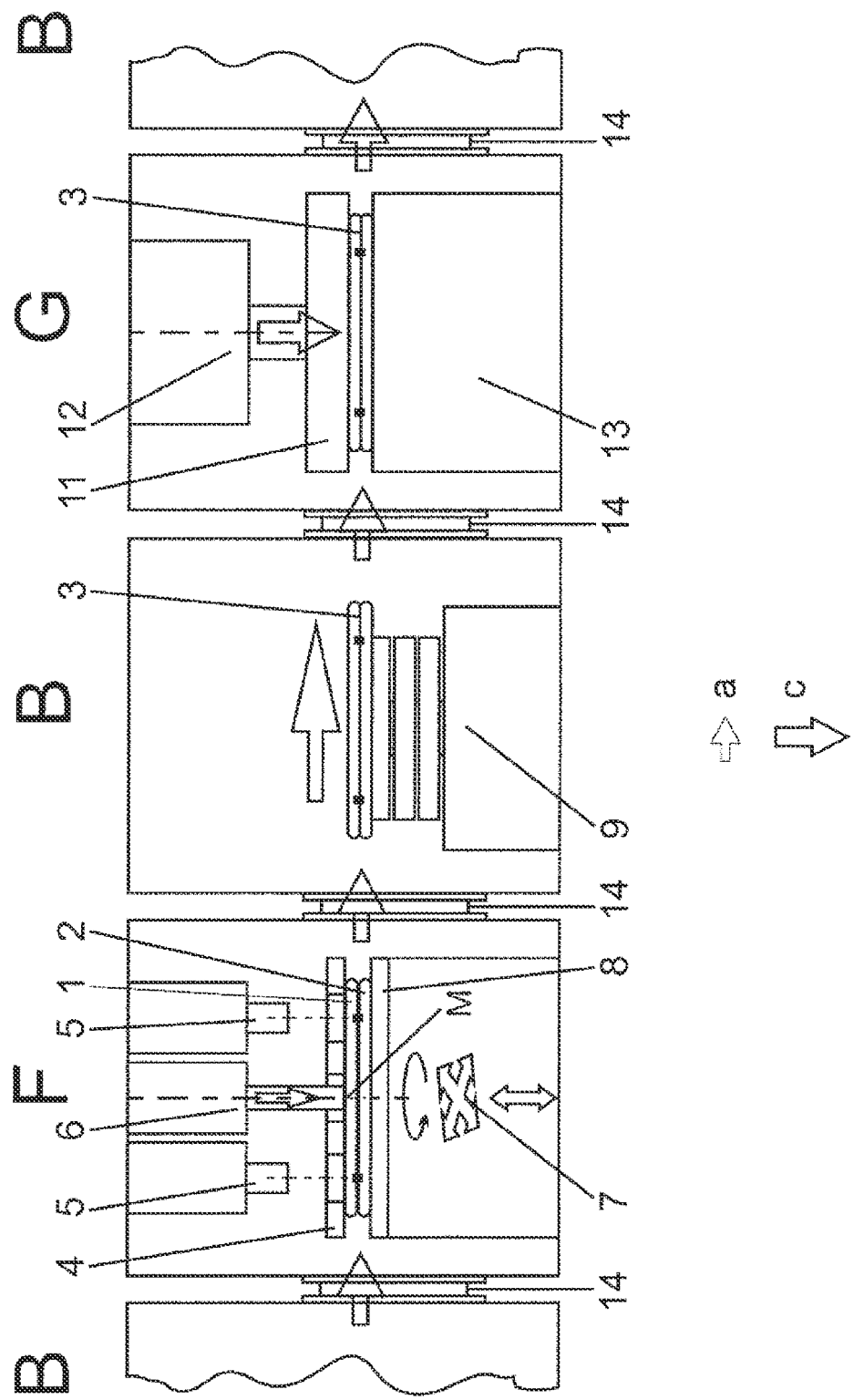

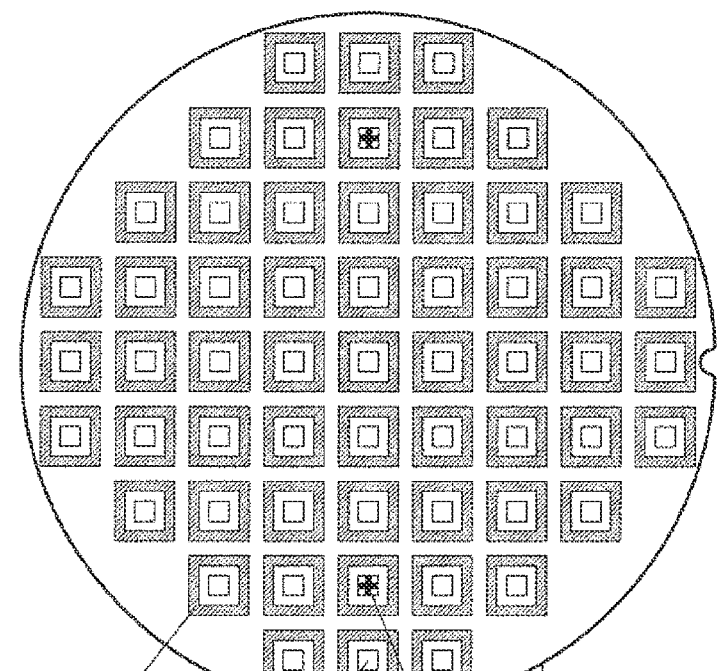
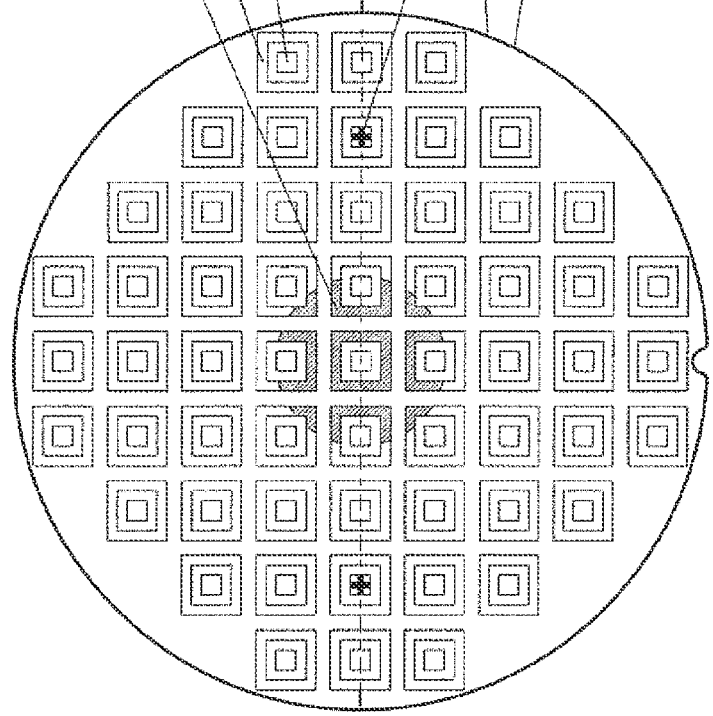

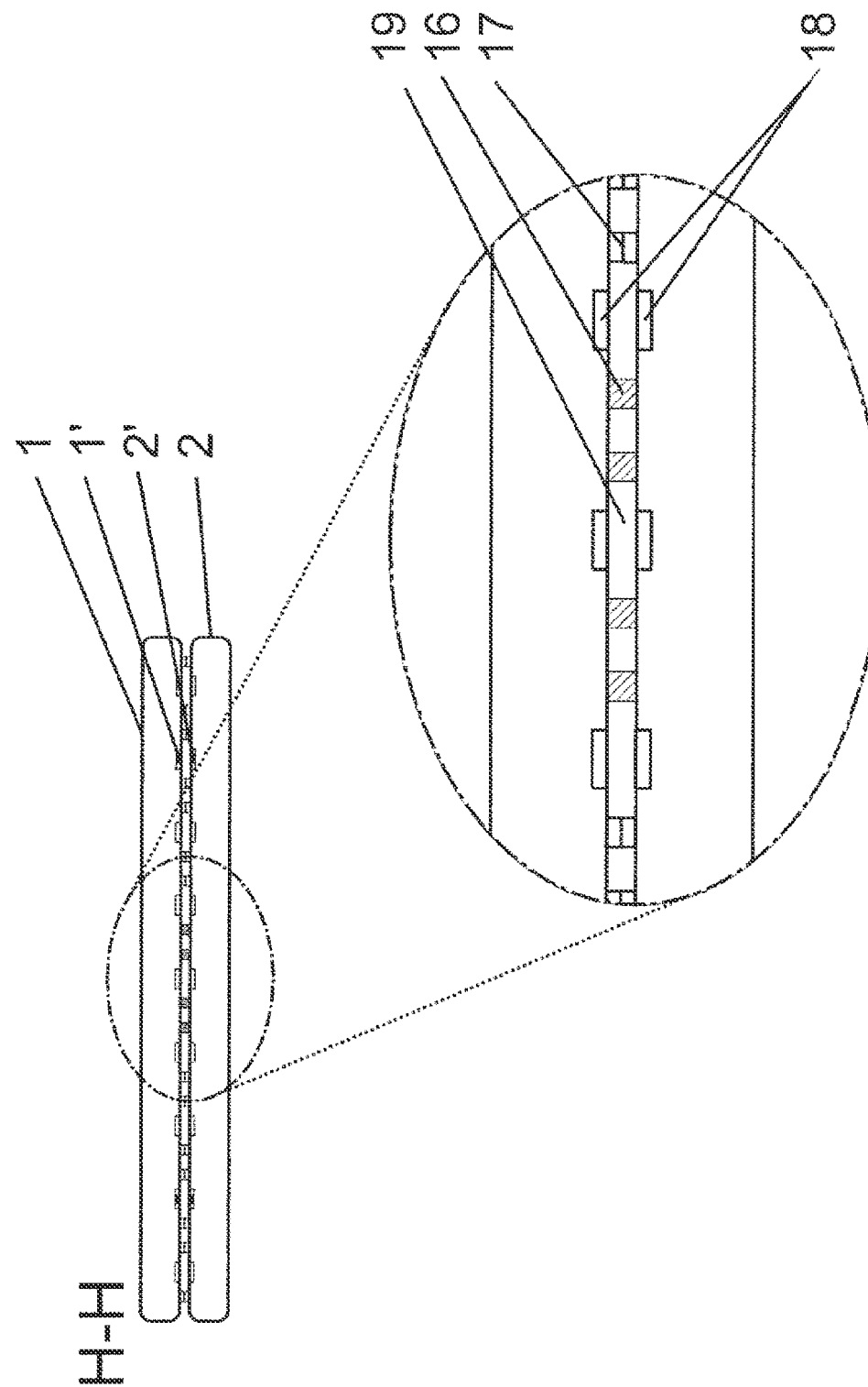

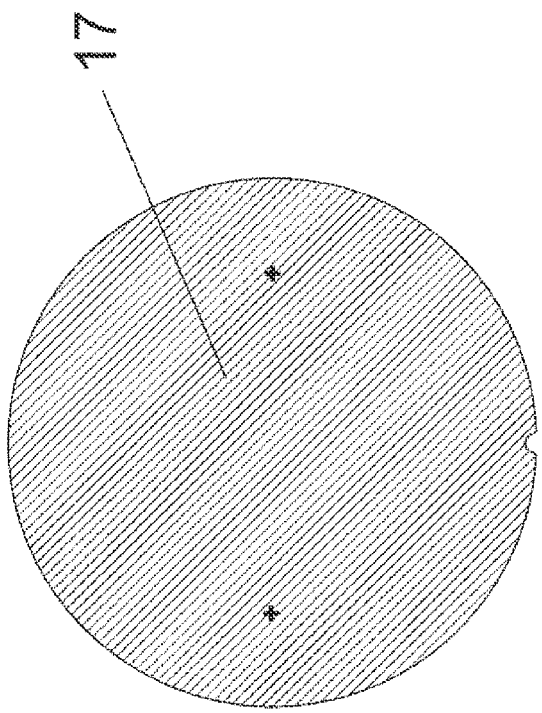
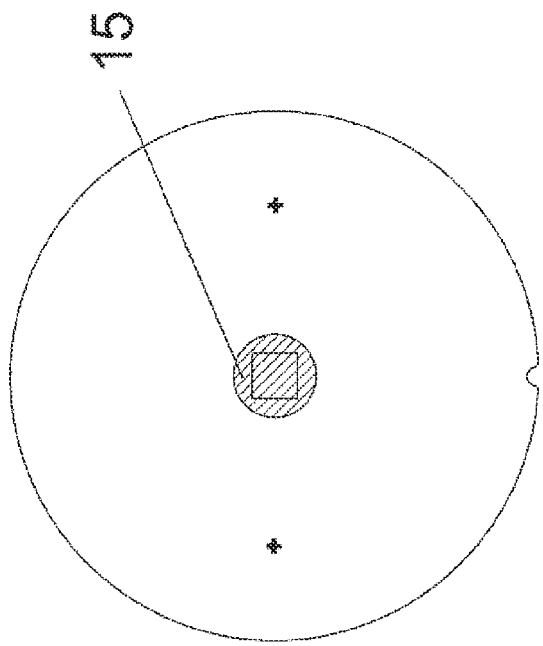

METHOD FOR PREFIXING OF SUBSTRATES

RELATED APPLICATIONS

This application is a division of U.S. application Ser. No. 16/556,511, filed Aug. 30, 2019, now U.S. Pat. No. 11,328,939, which is a continuation of U.S. application Ser. No. 16/294,235, filed Mar. 6, 2019, now U.S. Pat. No. 10,438,822, which is a division of U.S. application Ser. No. 15/535,082, filed Jun. 12, 2017, now U.S. Pat. No. 10,340,161, which is a U.S. National Stage Application of PCT/EP2014/079110 filed Dec. 23, 2014, said patent applications hereby fully incorporated herein by reference.

FIELD OF THE INVENTION

This invention relates to a method for prefixing substrates and a device for prefixing substrates.

BACKGROUND OF THE INVENTION

In the publications U.S. Pat. No. 6,563,133B1 and U.S. Pat. No. 7,332,410B2, the bonding of oxide-free substrate pairs at room temperature without external expenditure of force is disclosed. In this case, the substrate surfaces are modified by plasma treatment or ion implantation by the surfaces being treated with a semi-amorphous layer that includes boron or arsenic ions. After full-surface contact is made under normal pressure, the substrate pairs remain in a light vacuum atmosphere. A binding energy of approximately 400 mJ/m$^2$ is achieved at room temperature. In order to create a permanent bond, an annealing step also follows at up to 400° C. The substrates are limited to semiconductors such as Si, InGaAs, GaAs, Ge, and SiC.

The publication EP2672509A1 shows a cluster system with a pretreatment unit and a bonding unit. In this case, bonding surfaces are to be produced, which allow a bonding with sufficient bonding force without high vacuum.

The publication US2006/0132544A1 describes the sticking ("tacking") or prefixing of a composite film that has an adhesive layer. Partial areas of the adhesive layer are heated by a laser and thus the sticking is made possible.

The publication U.S. Pat. No. 5,686,226 uses a locally applied resin adhesive for sticking (product) substrates to one another by hardening (polymerization) of the adhesive by means of UV radiation.

In particular, the transport of substrates or substrate stacks causes considerable problems in the state of the art, since the substrates, on the one hand, are not to be damaged and, on the other hand, a possible alignment of the substrates is not to be changed. In addition, the transport is to be carried out in the smallest possible space.

SUMMARY OF THE INVENTION

The object of this invention is therefore to indicate a method and a device with which in particular the transport of the aligned substrates is improved. In addition, the bonding quality is to be enhanced, and less scrap is to be produced. Moreover, the flexibility is to be improved, and the cycle times are to be reduced.

This object is achieved with the features of the independent claim(s). Advantageous further developments of the invention are indicated in the subclaims. Also, all combinations of at least two of the features that are indicated in the specification, the claims, and/or the figures fall within the scope of the invention. In the indicated ranges of values, values as boundary values that lie within the above-mentioned limits are also to be considered as disclosed and can be claimed in any combination.

The basic idea of this invention is substrates in which at least one substrate surface of the substrates is pretreated, in particular amorphized, in at least one surface area, to align the substrates and then to make contact and to prefix them on the pretreated surface areas. The alignment and making contact as well as prefixing are done preferably in one and the same vacuum module chamber (prefixing module) that is uninterrupted in particular during alignment and making contact.

According to an advantageous embodiment of the invention, the substrates are then bonded, in particular without interrupting the vacuum in the module chamber. In a preferred high-vacuum environment (in particular <10e$^{-7}$ mbar, preferably <10e$^{-8}$ mbar), polished and/or pretreated substrate surfaces bond spontaneously and covalently by making pure contact without additional pressure (or at least only very low pressure), in particular at room temperature. Reference is made to the publication PCT/EP 2014/063303 with respect to the pretreatment.

The method according to the invention, the device derived therefrom, and the articles produced therefrom used the effects of the pretreatment in particular to prefix substrate pairs in an adjusting system (alignment system, in particular outside of the bonding chamber), without in this case using high contact forces and/or high temperatures, as were necessary in the case of full-surface permanent bonds. Preferably, the substrates are prefixed or temporarily bonded only at a few points or partial surfaces (surface areas).

Only in a subsequent bonding step (in the bonding chamber of a bonding module) are higher forces with a uniform surface load applied. This process can be supported by an additional temperature input.

The pretreatment is carried out in particular in a pretreatment module that can be separated from the prefixing module and/or the bonding module, in particular by sluices. In the latter, an amorphized substrate surface of the substrates (semiconductor material, oxides or polished metals such as Al, Cu, glass, ceramics) is created. The substrates are activated, and a high proportion of microcontact surface contacts are made possible upon contact between two substrates. Thus, spontaneous covalent bonds can be formed at low temperatures, in particular at room temperature. Making contact is preferably carried out under high vacuum.

The prefixing is done in particular by local energy input, in particular from a side that faces away from the substrate surface with which contact is to be made.

In order to reach an equivalent pressure for spontaneous bonds in partial surfaces and to prefix (to stick or "to tack") the substrates, in particular wafers, preferably a local application of energy, in particular force and/or heat, is carried out. The substrates are applied locally, in particular with one or more pressure dies, and are thus prefixed locally. The in particular three-axis adjusting system is preferably designed only for the resulting force of the partial application, so that the latter are less expensive and thus economical.

An in particular covalent bond (prefixing) that is strong enough to transfer the prefixed substrate pair into the bonding chamber is produced on the applied surface areas. There, pressurization over the entire surface is carried out for permanent bonding with optional heating.

The bonding strength of the prefixing is in particular so strong that the substrates retain their mutual alignment during transport.

For handling, in particular the transport from the alignment module or prefixing module to the bonding module or other processing modules, in particular a receiving system (substrate holder or chuck) on one of the two or on both holding sides (sides facing away from the substrate surfaces) of the substrate stack can be eliminated.

In further development of the invention, it is provided that at least one—and preferably all—of the substrate surfaces has/have a mean roughness index Ra that is less than 20 nm, preferably a mean roughness index Ra that is less than 1 nm. For all polished surfaces with a mean roughness index Ra of less than 20 nm (such as in particular aluminum, copper, oxides, semiconductor materials, and glass), a prefixing by local input of force in the adjusting system is possible.

An embodiment of the method according to the invention has in particular the following steps:

1) Introducing substrates or a pair of substrates into a high vacuum environment, in particular by a sluice, and transfer (in particular by means of a robotic arm) of at least one of the substrates into a pretreatment chamber of a pretreatment module,
2) Pretreatment of at least one of the substrates in such a way that the latter are suitable for spontaneous room temperature bonding,
3) Transfer (in particular by means of the robotic arm) to an adjusting system/alignment system/prefixing module (first module chamber),
4) Alignment of the two substrates to one another in the alignment system,
5) The two substrates making contact and local application of energy, in particular one or more local surface loads; as a result, prefixing takes place in such a way that the alignment of the substrates is fixed with respect to one another. As an alternative, it can also be prefixed over the entire surface,
6) Transfer (in particular by means of the robotic arm) of the prefixed substrate stack in a bonding module (second module chamber),
7) Partial or (preferably) full-surface application of a bonding force and optional heating for further strengthening of the connection, and
8) Discharging of the bonded substrates from the high-vacuum environment.

According to an embodiment of the invention, the method can optionally be repeated multiple times after step 5 in order to add additional substrates to the substrate stack before being bonded.

The method according to the invention is preferably applied in a high-vacuum, preferably ultrahigh-vacuum, environment that can be closed by sluicing. The modules that in particular can be additionally subjected to pressure are arranged within the high-vacuum environment.

According to an aspect of the invention, a separation of the (precision) alignment from the high input of force and optionally higher temperature taking place during bonding is carried out. Advantages in design are produced therefrom and lead to cost savings. Even forces greater than 1 kN along a Z-axis would make a precision mechanism for adjustment in the sub-µm range along an X- and Y-axis, in particular under high vacuum, extremely expensive, if not impossible. Thus, for example, no lubricants are allowed under high vacuum, and also no air bearings. Rolling and sliding bearings produce particles or even high backlash due to friction forces. In addition, the introduction of a high force along a Z-axis creates a high risk of having a negative influence on the X-Y alignment and thus the alignment accuracy.

Another advantage is the optimal productivity. Thus, for example, in a unit, the number of prefixing systems and bonding modules can be selected in such a way that an optimal throughput for the respective process is ensured. In particular, at the required temperature input and the associated heating and cooling times, it is preferred to use multiple bonding modules with a prefixing unit.

Another advantage of the invention is the modularity and thus retrofittability of the prefixing unit. With locally pre-bonded substrates, which are prefixed/stuck in an adjusting unit with prefixing, a high-vacuum unit can be retrofitted by adding a prefixing unit according to the invention.

The mean roughness index or arithmetic mean roughness index Ra describes the roughness of a technical surface. To determine this measurement value, the surface is scanned on a defined measurement section and all height and depth differences of the rough surface are recorded. After the calculation of the specific integral of this roughness plot on the measurement section, this result is subsequently divided by the length of the measurement section. The range of the roughness value reaches 25 µm in the case of very rough surfaces with traceable grooves, up to <20 nm for polished surfaces.

Advantageous material combinations for the substrates are combinations comprised of all materials that have a polished or polishable surface, preferably with a mean roughness index Ra of less than 20 nm. The following materials or combinations of materials are preferred:

Semiconductor materials, in particular Si, InP, GaAs, semiconductor alloys, III-V and II-IV compounds,
Metals, in particular Cu, Al,
Oxides, in particular $SiO_2$ or other oxides of semiconductor materials or semiconductor wafers with oxidized surfaces,
Nitrides, in particular SiNx,
Glass,
Glass ceramics, in particular Zerodur®,
Ceramic.

The invention is limited in particular to polished surfaces, which allow a pretreatment for covalent bonds. These are preferably surfaces with a mean roughness index Ra that is less than 20 nm, more preferably with an Ra of less than 1 nm, measured on a 2×2 µm² field with a scanning force microscope (Atomic Force Microscope, AFM). The local energy input or input of force is in particular large in order to sufficiently equalize microroughnesses so that a higher proportion of binding energies acting on surface molecules between the substrates can build up. The smaller the mean distance of the surfaces of two substrates on the atomic plane, the greater the adhesion. The adhesion accordingly depends on the roughness of the surfaces of the substrates that are to make contact.

The substrate surfaces can be pretreated by plasma treatment, whereby the microroughness of the substrate surfaces (topological structures) changes. When reaching an optimal surface roughness, maximal bonding energies can be achieved.

A partial aspect of an embodiment or further development of this invention, in particular relating to the pretreatment, is disclosed in PCT/EP2014/063303, and reference is made to this disclosure. PCT/EP2014/063303 describes a method and a device for surface treatment of substrates. The basic idea of PCT/EP2014/063303 is to create a predominantly amorphized layer on a substrate surface that is to be bonded. The amorphization of the substrate surface results in a better bonding result, in particular in the case of comparatively low temperatures. A cleaning of the surface for oxide removal and an amorphization are preferably carried out simultaneously. PCT/EP2014/063303 relates in particular to a method for permanent bonding of two substrates, of which at least one, preferably two, as described below, was/were treated before the bonding. Surface areas, in particular a contact side (preferably over the entire surface) of the two or of at least one of the two substrates, are amorphized before the bonding process. A layer that is one nanometer thick and in which the atoms of at least one of the surfaces to be bonded (contact sides) are arranged randomly is created by the amorphization. This random arrangement results in a better bonding result, in particular in the case of comparatively low temperatures. To create a bond according to the invention, in particular a cleaning of the surfaces (at least the contact sides), is performed in particular for releasing oxides. Preferably, cleaning and amorphization are carried out simultaneously, even more preferably by the same treatment. A significant aspect of the invention according to the invention is in particular the use of low-energy particles, in particular ions, whose energy is comparatively low, but is sufficient to produce the amorphization that is described according to the invention.

The removal of oxide from the substrate surfaces is advantageous for an optimal bonding process and a substrate stack with correspondingly high bonding strength. This applies in particular for all materials in which an oxygen-containing atmosphere forms an undesirable, native oxide. This does not necessarily apply for deliberately created oxygen substrate surfaces, such as, for example, for silicon oxide. In particular, preferably at least predominantly, even more preferably exclusively, damaging, unnecessary and/or native, in particular metal, oxides are removed according to the invention. Preferably, the above-mentioned oxides are removed as much as possible, in particular completely, before a bonding process, in order not to be embedded in the bonding boundary surfaces (contact surfaces of two substrates). Embedding of such oxides would result in mechanical destabilization and in a very low bonding strength. The removal of the oxide is carried out by physical or chemical methods. In an especially preferred embodiment according to the invention, the removal of the undesirable oxides is carried out with the same pretreatment system with which the pretreatment is implemented. As a result, the following:

Oxide removal
Surface smoothing
Amorphization can be performed simultaneously, in particular under optimal circumstances. In alternative embodiments according to the invention, the oxide removal is not carried out in the same unit. In this case, it must be ensured in particular that it does not result in any renewed oxidation of the substrate surfaces during transfer of substrates between the two units.

In the semiconductor industry, different bonding technologies to connect substrates to one another have already been used for several years. The connecting process is called bonding. A distinction is made between the temporary bonding method and the permanent bonding method.

In the case of the temporary bonding method, a product substrate is bonded to a carrier substrate in such a way that after processing, it can be dissolved again. Using the temporary bonding method, it is possible to stabilize a product substrate mechanically. The mechanical stabilization ensures that the product substrate can be handled without curving, deforming, or breaking. Stabilizations by carrier substrates are necessary in particular during and after a back-thinning process. A back-thinning process makes it possible to reduce the product substrate thickness to a few micrometers.

In the permanent bonding method, two substrates are bonded to one another continuously, i.e., permanently. The permanent bonding also makes possible the production of multi-layer structures (more than two substrates). These multi-layer structures can be comprised of the same or different materials. Different permanent bonding methods exist.

The permanent bonding method of the anodic bonding is used in particular to connect ion-containing substrates permanently to one another. Preferably, one of the two substrates is a glass substrate. The second substrate is preferably a silicon substrate. During anodic bonding, an electric field is applied along the two substrates that are to be bonded to one another. The electric field is created between two electrodes, which preferably bring the two surfaces of the substrates into contact. The electric field creates an ion transport in the glass substrate and forms a space charge zone between the two substrates. The space charge zone produces a strong attraction of the surfaces of the two substrates, which ensure contact with one another after the objects are brought together and thus form a permanent connection. The bonding process is thus based primarily on the maximization of the contact surfaces of the two surfaces.

Another permanent bonding method is the eutectic bonding. During eutectic bonding, an alloy is created with a eutectic concentration or the eutectic concentration is set during a process, in particular a heat treatment. By exceeding the eutectic temperature (the temperature at which the liquid phase is in equilibrium with the solid phases of the eutectic), the eutectic melts completely. The liquid phase of the eutectic concentration that is created wets the surfaces of the areas that are still not liquefied. During the solidification process, the liquid phase solidifies to form the eutectic and forms the connecting layer between the two substrates.

Another permanent bonding method is the fusion bonding. During fusion bonding, two flat, pure substrate surfaces are bonded by making contact. In a first step, the two substrates are brought into contact, whereby fixing of the two substrates takes place by van der Waals forces. The fixing is referred to as a prebond or prefixing. The bonding force of the prebond makes it possible to produce a prefixing, which is strong enough to bond the substrates tightly to one another in such a way that a mutual shifting, in particular by the application of a shearing force, is possible only with a considerable expenditure of energy. The two substrates, in particular by applying normal force, preferably can be relatively easily separated from one another again. In order to create a permanent fusion bond, the substrate stacks are subjected to a heat treatment. The heat treatment results in forming covalent connections between the surfaces of the two substrates. Such a permanent bond that is created is only possible by the application of a high force that accompanies a destruction of the substrates.

If the bonded substrates are equipped with functional units, in particular microchips, MEMs, sensors, and LEDs, they are preferably prefixed and/or bonded at low temperatures, in particular less than 200° C., preferably at room temperature. A temperature that lies below a temperature sensitivity threshold of the functional units is preferably selected. In particular, microchips have a relatively strong doping. At elevated temperatures, the doping elements have an elevated diffusivity, which can result in an undesirable, disadvantageous distribution of the dopings in the substrate. By this measure, thermal stresses can be minimized. Moreover, the process times for heating and cooling are shortened. In addition, shifts of different substrate areas, which are comprised of different materials, and in particular also have different thermal expansion coefficients, are reduced.

In further development in this connection, a plasma treatment for cleaning and activation of a substrate surface takes place in order to be able to bond at low temperatures, in particular if no oxygen-affine surfaces, in particular metal surfaces, are used. Monocrystalline silicon, which forms a silicon dioxide layer, is preferred, however. The silicon dioxide layer is extremely well suited for bonding.

In the state of the art, there are multiple approaches for direct bonding at lower temperatures. One approach in PCT/EP2013/064239 includes applying a sacrificial layer, which is dissolved in substrate material during and/or after the bonding process. Another approach in PCT/EP2011/064874 describes the production of a permanent connection by phase conversions. The above-mentioned publications relate in particular to metal surfaces, which are bonded more likely via a metal bond and not via covalent bonds. In PCT/EP2014/056545, an optimized direct bonding process of silicon by surface cleaning is described. The above-mentioned methods can be combined with this invention, and in this respect reference is made to the disclosure of the above-mentioned publications.

According to an advantageous embodiment of the invention, in particular substances or materials of the same type are to be connected to one another (bonded). The type similarity ensures that the same physical and chemical properties are present on the contact surfaces of the substrate surfaces (bond interfaces). This is in particular important for connections, across which electrical current is to be conducted, which are to have a slight tendency toward corrosion and/or the same mechanical properties. Preferred substances of the same type are:

Copper-copper
Aluminum-aluminum
Tungsten-tungsten
Silicon-silicon
Silicon oxide-silicon oxide.

Another aspect of this invention is in particular using the capability of different materials, in particular metals and/or oxides, to connect under external influences, in particular temperature and/or pressure, in order to obtain a local, in particular locally greatly limited, prefixing between the substrates. This is also referred to as "tacking." The method according to the invention is preferably used for substrates with amorphized layers. The amorphized layer can in this case be applied by chemical and/or physical deposition processes on the substrate surface or be created directly on the substrate surface. An in particular independent aspect of the invention is that the amorphized layer is not created by a material that is applied by means of physical and/or chemical processes but rather by a phase conversion of the substrate material. As a result, the deposition of a material that is in particular undesirable or harmful can be completely eliminated.

Below, further embodiments of the method steps according to the invention are disclosed:

Pretreatment of the Substrate Surfaces

The invention relates in particular to a method for tacking at least two substrates, of which at least one, preferably two, were treated as described below before the tacking.

Surface areas, in particular a contact side (preferably over the entire surface) of the two substrates or of at least one of the two substrates, are amorphized before the bonding process. According to the invention, the amorphization of surface areas that are in particular separated from one another and that are smaller than the substrate surface can also be carried out.

A layer that is a few nanometers thick, in which the atoms are arranged randomly, is created by the amorphization. The random arrangement leads to a better bonding result, in particular in the case of comparatively low temperatures.

To create a bond and/or prefixing according to the invention, in particular a cleaning of the substrate surfaces (at least the contact sides), in particular for releasing oxides, is performed. Preferably, cleaning and amorphization are carried out simultaneously, even more preferably by the same treatment.

Another aspect of the invention is in particular the use of low-energy particles, in particular ions, whose energy is set when striking against the substrate surface in order to produce the amorphization described according to the invention.

A step for removing an oxide from the substrate surfaces is preferably performed. This applies in particular for materials in which an oxygen-containing atmosphere forms a native oxide, but not for oxygen substrate surfaces that are created according to the invention, such as in particular for silicon oxide. In particular, oxides according to the invention—preferably at least predominantly, even more preferably exclusively, harmful, unnecessary and/or native, in particular metal oxides—are removed. Preferably, the above-mentioned oxides are removed to a very large extent, in particular completely, before a bonding process in order not to be embedded in the bonding boundary surface (contact surface of two substrates). An embedding of such oxides would lead to a mechanical destabilization and to a very low bonding strength. The removal of the oxide is carried out in particular by physical or chemical methods. In an especially preferred embodiment according to the invention, the removal of the undesirable oxides is carried out with the same pretreatment module, with which the pretreatment of the substrates is performed. As a result, the following can be performed simultaneously, in particular under optimal circumstances: oxide removal, surface smoothing, and/or amorphization. In alternative embodiments according to the invention, the oxide removal is not carried out in the same unit. In this case, it must be ensured in particular that no renewed oxidation of the substrate surfaces occurs during transfer of the substrates between the two units. This can be ensured in that the high vacuum during the oxide removal, the transport, and the pretreatment occurring until bonding is completed is not interrupted.

In other words, an idea according to the invention is in particular in the efficient, in particular locally limited, prefixing by increasing the bonding strength between two substrate surfaces by amorphization. In this case, the amorphization solves multiple problems:

The amorphization according to the invention in particular produces a planarization of the substrate surface. The planarization thus takes place in particular during the amorphization, in particular in addition to a planarization that is provided during the bonding process by the application of force.

In addition, the amorphization ensures a higher movability of the material on the interfaces. As a result, any possible residual roughness can be better compensated for. In particular, remaining gaps between the substrate surfaces can be closed.

In particular, a thermodynamically metastable state at the substrate surface (bonding boundary surface) is created by the amorphization.

In another process step (in particular after the surfaces to be bonded make contact), this metastable state results in a (back) conversion of partial areas of the amorphous layer into a crystalline state. In the ideal case, a complete conversion of the amorphous layer is carried out. The resulting layer thickness after making contact and the subsequent heat treatment of the amorphous layer are in particular greater than zero.

Another idea according to the invention is in particular in the creation of the amorphous layer that is comprised of the existing basic material of the substrate, in particular by particle bombardment. Preferably, before the bonding of the substrates, no material is applied to the substrate surfaces that are to be brought together. Since the prefixing of the substrates is preferably carried out only at a few points, another idea according to the invention is performing the amorphization only at the points provided for the prefixing. If the substrates that are prefixed by tacking according to the invention are completely bonded in a subsequent process step, a complete amorphization is preferred.

The method according to the invention makes possible in particular the production of a complete and/or local and/or full-surface, in particular mixed, contact of two substrate surfaces, of which at least one, preferably two, is/are amorphized according to the invention.

The method according to the invention is used in particular for the production of a contact that is complete and/or full-surface and/or unmixed of two, preferably different substrate surfaces.

In particular, the following materials can be prefixed with one another in any combination, preferably in each case the same materials:

Metals, in particular Cu, Ag, Au, Al, Fe, Ni, Co, Pt, W, Cr, Pb, Ti, Te, Sn, and/or Zn, Alloys Semiconductors (with corresponding doping), in particular
  Element semiconductors, preferably Si, Ge, Se, Te, B, and/or α-Sn,
  Compound semiconductors, in particular GaAs, GaN, InP, InxGa1-xN, InSb, InAs, GaSb, AlN, InN, GaP, BeTe, ZnO, CuInGaSe$_2$, ZnS, ZnSe, ZnTe, CdS, CdSe, CdTe, Hg(l-x)Cd(x)Te, BeSe, HgS, AlxGal-xAs, GaS, GaSe, GaTe, InS, InSe, InTe, CuInSe$_2$, CuInS$_2$, CuInGaS$_2$, SiC, and/or SiGe,
  Organic semiconductors, in particular flavanthrone, perinone, Alq3, perinone, tetracene, quinacridone, pentacene, phthalocyanines, polythiophenes, PTCDA, MePTCDI, acridone, and/or indanthrone.

In other words, the invention relates in particular to a method for, in particular locally limited, direct bonding. In this case, the invention is preferably based on the idea of amorphizing at least one surface (arranged in particular on the contact side) or a partial area of the surface of a substrate before the bonding process or the prefixing. The amorphization is preferably carried out not by the deposition of a material that is amorphously resublimated or condensed under the given deposition parameters at the substrate surface but rather in particular by an alteration, primary forming and/or phase conversion of an amorphous layer at the substrate surface. This is done in particular by the introduction of kinetic energy by particle bombardment, in particular ion bombardment, most preferably by a low-energy ion bombardment.

An at least partially amorphous structure of the formed amorphous layer is defined in particular as a phase batch, which includes at least of one amorphous phase and one crystalline phase.

The volume ratio between the amorphous phase and the total volume is to be referred to as the degree of amorphization. According to the invention, the degree of amorphization is in particular greater than 10%, preferably greater than 25%, even more preferably greater than 50%, most preferably greater than 75%, and all the more preferably greater than 99%.

The amorphization is limited in particular to the area that is near the surface of the substrates that are to be bonded to one another, preferably by selection of the process parameters temperature, pressure, ionization energy and/or ion current density during the amorphization. In particular, the material of the substrate, in this case apart from the amorphized layer according to the invention, remains at least predominantly, preferably completely, crystalline. In a first embodiment according to the invention, only the substrate surface or a part of the substrate surface of a first substrate is amorphized. The thickness d of the amorphous layer immediately after the creation according to the invention in a substrate surface is in particular less than 100 nm, preferably less than 50 nm, even more preferably less than 10 nm, most preferably less than 5 nm, and all the more preferably less than 2 nm.

In accordance with a further development according to the invention, the substrate surface of a first substrate and the substrate surface of a second substrate or partial areas of the substrate surfaces are amorphized. In a special embodiment according to the invention, the amorphization of two substrate surfaces is carried out in the same unit, in particular simultaneously, in order to create the same amorphous layers with the same process parameters. The amorphous layers that are created preferably have the same thickness d1 of the first amorphous layer of the first substrate and d2 of the second amorphous layer of the second substrate. The ratio of the thicknesses d1/d2 of the two amorphous layers, in particular created simultaneously, is $0.6<d1/d2<1.4$, preferably $0.7<d1/d2<1.3$, even more preferably $0.8<d1/d2<1.2$, most preferably $0.9<d1/d2<1.1$, and all the more preferably $0.99<d1/d2<1.01$.

The substrate surfaces or the partial areas of the substrate surfaces that are treated according to the invention have a slight, but in particular not insignificant, roughness before, during, and after the amorphization. In a preferred embodiment, the roughness of the substrate surface or of the partial areas of the substrate surface that are treated according to the invention during the amorphization is reduced and has a minimum after the amorphization. The roughness is indicated either as a mean roughness, quadratic roughness, or as an averaged depth of roughness. The determined values for the mean roughness, the quadratic roughness, and the averaged depth of roughness are different in general for the same measurement section or measurement surface, but lie in the same range of order of magnitude. A measurement of the surface roughness is done with one of the measuring devices (known to one skilled in the art), in particular with a profilometer and/or an atomic force microscope (AFM). In this case, the measuring surface is in particular 2 μm×2 μm. Therefore, the following numerical value ranges for the roughness are defined either as values for the mean roughness, the quadratic roughness, or for the averaged depth of roughness. The roughness of the substrate surface or of the partial areas of the substrate surface that are treated according to the invention before the amorphization is in particular, according to the invention, less than 20 nm, preferably less than 10 nm, even more preferably less than 8 nm, most preferably less than 4 nm, and all the more preferably less than 1 nm. The roughness of the substrate surface or of the partial areas of the substrate surface that are treated according to the invention after the amorphization is in particular less than 10 nm, preferably less than 8 nm, even more preferably less than 6 nm, most preferably less than 4 nm, and all the more preferably less than 1 nm.

The ratio between the entire surface F of the substrate and the cleaned and/or amorphized surface f is referred to as a degree of purity r. Before the bonding process according to the invention, the degree of purity is in particular greater than 0, preferably greater than 0.001, even more preferably greater than 0.01, most preferably greater than 0.1, and all the more preferably 1. The degree of purity r also corresponds in particular to the ratio between the surface of the tacked partial areas f' and the surface of the entire surface F.

The cleaning and/or amorphization preferably take place in the pretreatment module that is designed preferably as a vacuum chamber. The vacuum chamber can be evacuated to be in particular less than 1 bar, preferably less than 1 mbar, even more preferably less than $10^{-3}$ mbar, most preferably less than $10^{-5}$ mbar, and all the more preferably less than $10^{-8}$ mbar. In particular before the ions are used for amorphization, the vacuum chamber is evacuated preferably to a pre-established pressure, and is even more preferably completely evacuated. In particular, the proportion of oxygen and in particular also the proportion of moisture (water content) in the process chamber are greatly reduced so that a renewed oxidation of the substrate surfaces is not possible.

The ionization process is described in particular in PCT/EP2014/063303, to which reference is made in this respect. The exact selection of the angle of incidence makes possible the control of the removal rate and thus the surface roughness. The angle of incidence is selected in particular so that amorphization, removal of contaminants, in particular oxides, and surface smoothing are maximized for the target result. Maximization is defined in particular as a complete removal of contaminants, in particular oxides, a still further, in particular complete, smoothing of the surface (i.e., a reduction of the roughness value to zero), as well as an optimal amorphized layer. Gases or gas mixtures and parameters such as kinetic energy of particles, angle of incidence of the ion beam, current density, and treatment time were described in PCT/EP2014/063303.

Alignment/Adjustment and Prefixing/Tacking

After the pretreatment (amorphization and/or cleaning) of at least one of the two substrate surfaces, in particular an alignment of the two substrates to one another is carried out in an alignment module. Preferably, the alignment is carried out by adjusting or aligning units (aligner), in particular based on alignment marks on the substrates. The moment that the substrates are laid down/make contact is especially critical since alignment errors add up and/or can no longer be easily corrected. This results in considerable scrap. According to the invention, in particular an adjustment accuracy or an offset of less than 100 μm is thus the goal, in particular less than 10 μm, preferably less than 1 μm, with utmost preference less than 100 nm, and most preferably less than 10 nm.

The tacking is carried out in particular in the same module, i.e., in the alignment module, in which also the alignment of the respective substrates takes place/took place. In an alternative embodiment, the tacking can also take place in a separate prefixing module. The tacking is performed by means of a prefixing unit, which is suitable to connect two substrates at least locally to one another. Preferably, the entire surface or preferably one (or more) partial surface(s) is/are subjected to a preset (low) force and/or an energy input for prefixing. Then, a bonding strength that is sufficient for the prefixing is produced therefrom. Preferably, because of the prefixing, a full bonding strength between the substrates is not achieved. The bonding strength is preferably set in such a way that the substrates are fixed during transport.

According to a first embodiment, only a partial surface of a substrate makes contact with the second substrate. This is in particular by local application of a force in order to achieve the equivalent pressure for spontaneous bonds in partial surfaces for prefixing substrates. Spontaneous bonding is dependent on the surface type (material, roughness, etc.) and on the surface pretreatment (polishing, chemical cleaning, etc.). Bonding is referred to as spontaneous when the bonding wave propagates without external action (such as, e.g., pressure), i.e., on its own. Thus, the alignment is fixed with the prescribed alignment accuracy, without in this case using the disadvantageously necessary high contact forces or temperature for full-surface bonding.

In a second embodiment, it is tacked over the entire surface, and a corresponding bond is produced by still lower bonding force relative to the entire substrate surface. The bonding strength is sufficient in particular to fix the substrates during transport. In this case, it applies in principle that the bonding strength is a function of roughness, degree of amorphization, and thickness of the amorphous layer as well as the applied force.

In an embodiment according to the invention, the prefixing unit is a device that is able to apply heat locally, in particular in a pulsed manner, on the contact surface. To create heat, in particular electric fields, magnetic fields, or electromagnetic radiation, preferably lasers, can be used.

In further development of the invention, the prefixing unit is designed as an electrode. The electrode is capacitively coupled via the two substrates that are to be connected to one another with a counter electrode, in particular a plate or part of a corresponding specimen holder. The electrode preferably has an electrode tip that is as pointed as possible in order to increase the electric field strength. The electric field strength is in particular greater than 0.01 V/m, preferably greater than 1 V/m, even more preferably greater than 100 V/m, most preferably greater than 10,000 V/m, and all the more preferably greater than 1 MV/m. In a quite especially preferred embodiment, the electrodes are loaded with an a.c. voltage. The frequency of the a.c. voltage is in particular greater than 10 Hz, preferably greater than 1,000 Hz, even more preferably greater than 100,000 Hz, and most preferably greater than 10 MHz. The a.c. voltage is suitable in particular for point tacking according to the invention when the substrates comprise, in particular predominantly, of dielectric material, which represents a barrier for the current flux of a d.c. voltage. In the case of at least partially present metal layers, a heating by the so-called "skin effect" is carried out by the use of a.c. voltage according to the invention.

In an alternative further development, the prefixing unit is designed as a unit for generating electromagnetic radiation, preferably as lasers. The laser has in particular a wavelength that ensures an optimal heating at least of a material in the substrate stack. The wavelength preferably lies in a range of between 1 nm and 1 mm, even more preferably between 200 nm and 1 mm, even more preferably between 400 nm and 1 mm, most preferably between 600 nm and 1 mm, and all the more preferably between 800 nm and 1 mm. The laser is therefore preferably an infrared laser. The diameter of the laser beam is in particular less than 10 mm, preferably less than 5 mm, even more preferably less than 2 mm, most preferably less than 1 mm, and all the more preferably less than 0.5 mm. The laser output is in particular greater than 10 W, preferably greater than 100 W, even more preferably greater than 1,000 W, and most preferably greater than 0.01 MW.

In another alternative embodiment, the prefixing unit has a microwave source, in particular an amplitron, magnetron, stabilotron, carcinotron or klystron. The microwaves of the microwave source are directed, in particular focused, by optical elements, in particular waveguides, even more preferably hollow waveguides, onto the points on the substrates that are to be tacked, preferably without striking the points of the substrates that are not to be tacked. The use of microwave sources is especially preferred when the substrate surfaces are wetted with a residual moisture, in particular a monoatomic layer of water. Owing to the specific, local irradiation with microwaves, the substrate surfaces are greatly heated by means of the water, so that a permanent connection of the substrate surfaces, in particular silicon and/or silicon dioxide surfaces, is produced by oxygen bridges. The diameter of the microwave beam focused by waveguides, in particular hollow waveguides, is in particular less than 10 mm, preferably less than 5 mm, even more preferably less than 2 mm, most preferably less than 1 mm, and all the more preferably less than 0.5 mm. The microwave source output is preferably greater than 10 W, preferably greater than 100 W, even more preferably greater than 1,000 W, and most preferably greater than 0.01 MW.

In another embodiment according to the invention, the prefixing unit is designed as a pressure device, which is designed to impose one or more local surface loads onto the substrates. The surface load is introduced in particular by a pressure die. A pressure surface of the pressure die on a pressure side of the substrate that faces away from the bonding side lies in particular in the range of between 0.5 mm$^2$ and 1,000 mm$^2$, preferably between 0.5 mm$^2$ and 500 mm$^2$, even more preferably between 1 mm$^2$ and 100 mm$^2$, and most preferably between 4 mm$^2$ and 100 mm$^2$. The pressure that is transferred/transferable with the pressure die lies in particular between 0.1 N/cm$^2$ and 1,000 N/cm$^2$, preferably between 1 N/cm$^2$ and 600 N/cm$^2$, and even more preferably between 1 N/cm$^2$ and 400 N/cm$^2$. Control is exercised by the pressure or force with which the pressure dies strike the substrate. The size of the partial surface for prefixing depends on the defined or preset bonding strength for prefixing.

The latter is—in particular for a 200 mm-Si wafer— greater than 0.1 J/m$^2$, preferably greater than 0.2 J/m$^2$, even more preferably greater than 0.5 J/m$^2$, most preferably greater than 1 J/m$^2$, and all the more preferably greater than 1.5 J/m$^2$.

Preferably, one of the two substrate holders has a cutaway or an indentation, so that the pressure die can act directly on the substrate. The process is performed with a pressure die, preferably in the center of the substrate, or alternatively with multiple pressure dies. On the partial surfaces struck by the pressure die(s), a covalent bond is created that is strong enough to transfer the tacked substrate pair into a bonding chamber for a final pressurization over the entire surface and optionally heating of the substrate pair. The alignment unit can thus be designed for the resulting prefixing force, which is lower than in the state of the art. The force that is necessary for reaching the (maximum necessary) bonding strength depends in particular on the quality of the surface, the thickness of the amorphous layer, the degree of amorphization, the surface roughness, the cleanliness of the surface and/or of the material, or the material combination of the substrates.

If two pressure dies are used, the latter are arranged in particular at an angle of 180° to one another. In another embodiment, a pressure die is positioned in the center, and a second is positioned with a central or outer radius. If three pressure dies are used, the latter are preferably arranged in an equilateral triangle (angle to one another of 120°). If four pressure dies are used, the latter are positioned at an angle of 90° to one another. If at least two pressure dies are used, the latter are preferably arranged symmetrically. If at least two pressure dies are arranged symmetrically, in addition a pressure die can also be used in the center.

Preferably, the pressure dies are arranged uniformly distributed on the substrates.

When multiple pressure dies are used, the latter can be subjected to force sequentially individually or in groups in order to minimize the load for the substrate holders.

In an embodiment according to the invention, the prefixing module has specifically a prefixing unit, which is suitable for exerting an in particular mechanical pressure on the surface of the substrate stack, in particular on the surface of the product substrate. The prefixing unit can be a point force-application unit according to the invention. The point force-application unit is preferably created in the shape of a pin. The tip of the pin can have different shapes. Thus, pointed tapering shapes, rounded, in particular spherical, shapes, or rectangular shapes are conceivable. The tacking uses local application of force in order to reach the equivalent pressure for spontaneous bonds in partial surfaces and thus to prefix or to tack the substrates.

In further development of the invention, the prefixing unit is in addition heatable. The temperature of the prefixing unit can be regulated in particular with an accuracy of better than 5° C., preferably better than 2° C., even more preferably better than 1° C., most preferably better than 0.1° C., and all the more preferably better than 0.01° C. The controllable temperature range of the prefixing unit lies in particular between room temperature and 700° C., preferably between room temperature and 300° C., even more preferably between room temperature and 120° C., most preferably between 18° C. and 30° C., and all the more preferably at room temperature. The introduction of heat primarily leads to a (locally limited) heating.

In another embodiment according to the invention, the point force-application unit has a laser that can be focused in particular as exactly as possible. The coherent laser light is bundled by optics, preferably in a focus that is located between the product substrate and the carrier substrate, i.e., in the connecting layer. As a result, an intensive and quick heating of the connecting layer that is as locally limited as possible is produced. The laser is preferably pulsed, in particular by continuous, preferably high-frequency, switching on and off. By such a pulsing, the heating of the environment is avoided to a large extent or completely. The laser is in particular an infrared laser, a laser for visible light, or a laser for UV light.

In an especially preferred embodiment, the prefixing unit combines a heating unit and/or pressure unit and/or laser unit, so that at the same time, thermal and/or mechanical and/or photochemical stresses are possible. According to a preferred embodiment of the invention, the prefixing unit can be moved at least along the z-axis in any embodiment.

According to another embodiment according to the invention, it is conceivable to tack to the full surface and to produce a corresponding bond by a force that is smaller but corresponds to the entire substrate surface. This embodiment involves the prefixing unit, preferably a pressure device that can apply a surface load on the full surface with a pressure plate. The prebond that is produced is distinguished in particular by a bond strength of between 0.01 J/m² and 5 J/m², preferably greater than 0.1 J/m², preferably greater than 0.2 J/m², even more preferably greater than 0.5 J/m², most preferably greater than 1 J/m², and with utmost preference greater than 1.5 J/m².

The invention is preferably applied in the case of polished substrate surfaces, which make possible a pretreatment for covalent bonds. These are typically substrate surfaces with a mean roughness index Ra that is less than 20 nm, preferably with an Ra of less than 10 nm, even more preferably with an Ra of less than 2 nm, and most preferably with an Ra of less than 1 nm measured on a 2×2 µm² field with AFM. The mean roughness index or arithmetic mean roughness index Ra describes the roughness of a technical surface. To determine this measured value, the surface is scanned on a defined measurement section and all differences in height and depth of the rough surface are recorded. After the calculation of the specific integral of this roughness plot on the measurement section, this result is ultimately divided by the length of the measurement section.

The local input of force is carried out in particular in such a way that the microroughness of the substrate surfaces is overcome, and as high a proportion of surface molecules of the opposite substrates as possible builds up binding energies. In particular, polished substrate surfaces that are comprised of metals, such as aluminum, copper, oxides, semiconductor materials and glass, are suitable for a prefixing by local input of force. For many types of bonds, such as in particular glass-frit bonding or eutectic bonding or in the case of unpolished metal surfaces or solder joints, the surface quality is not sufficient to generate a spontaneous partial-surface connection with the disclosed force ranges. In these cases, preferably in addition mechanical clamping of the substrate stack is done after the alignment and after contact is made. This is achieved in particular by clamping according to PCT/EP2013/056620.

As an aspect of the invention that is in particular independent, it is conceivable not to use any polished substrate surfaces and/or to allow the pretreatment to be omitted, in particular when the substrates are equipped with spontaneously bonding structures. This is the case in particular when the substrates have surface structures that are similar to a Velcro closure. By contact, elastic or else plastic deformation of the surface structures is produced, and it results in a connection by friction of the substrate surfaces on the microscopic plane. In the bonding step below, the prefixing can be expanded on the entire surface and stabilized with use of high full-surface force and temperature.

Bonding

The bonding is done in particular in a separate bonding chamber, whereby the bonding chamber, preferably in a cluster unit, is connected integrally to the process chamber for pretreatment, in particular amorphization, and even more preferably, with a steadily maintained evacuation, can be moved from the process chamber into the bonding chamber.

In another step according to the invention, the bonding process of the prefixed/tacked substrate stack for forming a permanent bond is carried out. The bonding process is comprised in particular of the action of a force and/or temperature. The bonding temperature according to the invention is in particular less than 1,100° C., preferably less than 400° C., even more preferably less than 200° C., most preferably between 18° C. and 200° C., and all the more preferably room temperature. In this case, the bonding force lies in particular between 0.5 and 500 kN, preferably between 0.5 and 250 kN, more preferably between 0.5 and 200 kN, and most preferably between 1 and 100 kN. The corresponding pressure areas are produced by standardizing the bonding force according to the invention on the surface of the substrates. The target bonding strength for the full-surface bond is preferably greater than 1 J/m², preferably greater than 1.5 J/m², and more preferably greater than 2 J/m². The substrates can have any shape. In particular, the substrates are round and are characterized across the diameter according to the industry standard. For substrates, in particular the so-called wafers, the industry-standard diameters of 1 inch, 2 inches, 3 inches, 4 inches, 5 inches, 6 inches, 8 inches, 12 inches and 18 inches preferably apply. In principle, however, with the method according to the invention, any substrate, in particular a semiconductor substrate, can be processed independently of its diameter.

According to the invention, pressurization causes the substrate surfaces to approach each other additionally in the boundary layer (formed along the contact surface of the substrate surfaces) at which no contact is yet made by the prebonding. The bringing of the substrate surfaces closer and closer together results in a continuous reduction and an ultimate closure of cavities. According to the invention, in this case, the amorphization plays a decisive role, since a surface-isotropic electrostatic attraction is created by the amorphous state. Since the amorphous layers of the substrate surfaces that make contact with one another are both not crystalline, it is also not necessary to take into account a suitable contact that continues onto the crystal lattice. The contact between two substrate surfaces with amorphous layers thus results in creating a new, larger, amorphous layer. The transition is configured in a flowing manner and is characterized according to the invention in particular by the complete disappearance of a boundary layer.

The thickness of the entire finish-bonded amorphous layer of the substrate stack, in particular immediately after the bonding process, is in particular less than 100 nm, preferably less than 50 nm, even more preferably less than 10 nm, most preferably less than 5 nm, and all the more preferably less than 2 nm. The bonding strength is influenced in particular by the following parameters, namely The thickness of the amorphous layer,
The roughness,
The number of ions that are present in the boundary layer and that have a negative effect, and
The bonding force.

The bonding strength in particular increases with increasing thickness of the amorphous layer. The thicker the amorphous layer, the larger the number of randomly arranged atoms. The randomly arranged atoms are not subject to any long-range and/or short-range parameters, and cavities are filled to the boundary layer by the above-mentioned processes, in particular diffusion and/or bringing together by pressurization. In this connection, the contact surface and thus the bonding strength are increased. The mean thickness of the amorphous layer is preferably greater than the mean roughness, so that sufficient atoms of the amorphous phase are available in order to close the cavities. Preferably, a substrate surface with a very slight roughness is selected, so that the latter has cavities that are as small as possible. That is to say, the slighter the roughness of a substrate surface, the smaller the thickness of the amorphous layer can also be in order to obtain a target bonding result. A correspondingly thick amorphous layer is achieved according to the invention by a correspondingly high ionization energy, which results in that the ions can penetrate as deeply as possible into the substrate.

The bonding strength is also a function of the purity of the amorphous layer. Any embedded undesirable atom or ion can lead in particular to destabilization, in particular reduction of the bonding strength. The ions that are used for amorphization can therefore also have a negative influence on the bonding strength, in particular if they remain in the amorphous layer after the amorphization. Therefore, in addition to correspondingly low ionization energy, a lowest possible current density and treatment time are also desired. If the current intensity is multiplied by the treatment time, the ions that strike the substrate surface within the treatment time per unit surface section are obtained. In order to minimize this number, the current density and/or the treatment time can be reduced. The fewer ions per unit surface strike the substrate surface, the fewer ions are implanted in the amorphous layer. Primarily the particles that cannot enter into any bond with the material to be amorphized can have negative effects on the bonding strength and are present only as defects, in particular point defects. These primarily include the noble gases, but also molecular gases. In particular, according to the invention, the use of gases or gas mixtures, whose ions are responsible for a reinforcement of the bonding interface, in particular by forming new phases, is conceivable. A preferred option is the use of ionized nitrogen, which nitrates the amorphous layer.

Analogous considerations apply for all other types of elements that participate in a connection, in particular a metal, covalent or ionic bond with the material of the amorphous layer. In order to be able to reduce the current density, in particular substrate surfaces that already have a minimal roughness are preferred. The smoother the substrate surface, the fewer and lower-energy ions are required according to the invention for the reduction of roughness. As a result, a reduction of the ionization energy and/or the ion stream and thus the number of ions per unit surface is made possible, which in turn leads to a lower number of incorporated ions and consequently to fewer defects and ultimately to an increased bonding strength.

Bonding strength is a function of bonding force, since a higher bonding force leads to bringing the substrate surfaces closer together and thus to a better contact surface. The higher the bonding force, the more easily the substrate surfaces are brought toward one another, and the cavities are thus closed by locally deformed areas.

A heat treatment, which is separate in particular from the amorphization process, is carried out in particular either during and/or after the bonding occurs in the bonder or after the bonding occurs in an external heat treatment module (in particular integrated into the cluster). The heat treatment module can be a hot plate, a heating tower, a furnace, in particular a continuous furnace, or any other type of heat-generating device. The heat treatment takes place in particular at temperatures of less than 500° C., preferably less than 400° C., even more preferably less than 300° C., most preferably less than 200° C., and all the more preferably less than 100° C., but above room temperature. The time period of the heat treatment is selected in particular in such a way that after the heat treatment, the thickness of the amorphous residual layer according to the invention is less than 50 nm, preferably less than 25 nm, even more preferably less than 15 nm, most preferably less than 10 nm, and all the more preferably less than 5 nm.

In particular, during and/or after bonding and/or in the case of heat treatment, a phase conversion from the amorphous state into the crystalline state is carried out. In a quite preferred embodiment according to the invention, the above-mentioned process parameters are selected in such a way that a complete conversion of the amorphous layer into the crystalline phase is carried out.

According to an advantageous embodiment, a material with a purity of the material to be converted is selected in percent by mass (m %) in particular to be greater than 95 m %, preferably greater than 99 m %, even more preferably greater than 99.9 m %, most preferably greater than 99.99 m %, and all the more preferably greater than 99.999 m %. Because of the high purity of the substrate material, an even better bonding result is achieved.

Finally, the bonded substrates are discharged from the high vacuum. This can be carried out, for example, via a sluice gate, in particular a "gate valve."

With the method and device according to the invention, very high bonding strengths (>2 J/m$^2$) can be achieved at room temperature. In this case, devices with or without precision adjustment (without an adjustment unit) can be used. The pretreatment module preferably creates an amorphized surface of the substrates (for example, semiconductor material, oxides or polished metals, such as Al, Cu, glass, ceramics). The substrates are in particular activated, and a higher proportion of microcontact surface contacts is made possible upon contact between two substrates. Thus, spontaneous covalent bonds can be formed at low temperatures, also at room temperature. These spontaneous bonds are promoted by making contact under high vacuum, preferably under ultrahigh vacuum (<1 E$^{-6}$, better<1 E$^{-7}$ mbar).

Additional advantages, features, and details of the invention follow from the description below of embodiments that are preferred and based on the drawings.

BRIEF DESCRIPTION OF THE DRAWINGS

FIG. 1 a diagrammatic depiction of an embodiment of the device according to the invention, suitable for performing a method according to the invention, in a view from above, FIG. 2 a lateral partial view of the embodiment of FIG. 1 with an alignment module F and a bonding station G with in each case a transfer chamber B in between, FIG. 3*a* an overview of a first substrate of a substrate stack in a diagrammatically-indicated prefixed state, FIG. 3*b* an overview of the first substrate of FIG. 3*a* in a bonded state, FIG. 4 a lateral view of a substrate stack with an enlargement cutaway, FIG. 5*a* an overview of a substrate stack with a hatched prefixing area, and FIG. 5*b* an overview of a bonded substrate stack.

In the figures, features that are the same or that have the same effect are identified with the same reference numbers.

DETAILED DESCRIPTION OF THE INVENTION

The invention is explained in more detail below based on an embodiment. The features described therein can be used both individually and in any combinations.

The embodiment that is shown is based in particular on the idea of substrates 1, 2 making contact in a manner that is coordinated and simultaneously almost on their own at selected points and thus being fixed to one another as a substrate stack 3, by at least one of the two substrates, preferably the upper substrate 1, being applied with a pressure die 6 preferably concentrically to a center M of the substrate stack and the substrates being prefixed by this contact, in particular in the center M of the upper first substrate 1.

In a unit according to the invention, in particular the process steps of preadjustment, pretreatment (oxide removal and/or amorphization), alignment and prefixing, bonding, and optionally an inspection (metrology) are integrated. The unit has in particular at least one module group with a common working space 20 that can be sealed off relative to the ambient atmosphere and that is designed in particular for a high-vacuum atmosphere k. In particular, the modules, in particular a pretreatment module D, an alignment module F, and a bonding module G, can be arranged linearly with in each case a transfer chamber B with a movement system (robotic system) in-between.

As an alternative, according to a preferred embodiment, the modules can be arranged in the shape of a cluster or star around a central module with a movement system (robotic system). The star-shaped variant is especially advantageous when additional modules according to the invention are arranged around a central module, whereby these modules can be docked in particular on the central module. The movement system is preferably an industrial robot that is equipped in particular with an end effector.

FIG. 1 shows a device that is suitable for performing the method according to the invention with the individual modules or stations in the working space 20 in a view from above. A sluice A is used to introduce substrates 1, 2 from an ambient pressure outside of the working space 20 into the high-vacuum atmosphere k of the working space 20. At the other end of the working space 20, a sluice A is used to discharge the substrates 1, 2, processed in the modules, in particular as a bonded substrate stack 3.

The loading and discharging are depicted in FIG. 1 by an arrow b. In this case, the sluice A ensures that the vacuum value of the high-vacuum chamber (for example, the transfer chamber B) is impaired only minimally or not at all by introducing new substrates 1, 2 or by recovering the bonded substrate stack 3. Preferably, the sluice A comprises a sluice chamber, which for introducing the substrates into the chamber is connected to the environment by at least one valve. With at least one second valve, the sluice chamber is connected to the high-vacuum environment. The supply of the substrates 1, 2 in the high vacuum is carried out in particular via in each case one of the transfer chambers B. The sluice A is equipped in particular with a pumping system, which after closing the valve can drop the sluice chamber from ambient pressure (approximately 1,013 mbar) to a pressure close to that of the transfer chamber B.

This pressure is in particular less than $1\ E^{-4}$ mbar, preferably less than $1\ E^{-5}$ mbar, even more preferably less than $1\ E^{-6}$ mbar, and most preferably less than $1\ E^{-7}$ mbar. After reaching the target pressure in the sluice chamber, the valve can be opened to the transfer chamber B, and the substrates 1, 2 are transferred via a robotic arm that is built in particular in the transfer chamber B from the sluice A into a target chamber, in particular a preadjustment system C.

As pumping systems for achieving such a vacuum, in particular displacement pumps are suitable, preferably dry-running scroll, piston, or membrane pumps. Turbomolecular pumps are preferred for the range of below 1 mbar to below $1\ E^{-6}$ mbar and so-called "cryopumping" for its very high vacuum to below $1\ E^{-8}$ mbar.

The substrates 1, 2 are transported from one process station/process module to another via a robotic arm 9, in particular without significantly changing the vacuum level, preferably via one or more transfer chambers B. This process is shown in FIG. 1 by arrow a. In the transfer chamber(s) B, a vacuum of less than $1\ E^{-5}$ mbar, preferably less than $1\ E^{-6}$ mbar, even more preferably less than $1\ E^{-7}$ mbar, and most preferably less than $1\ E^{-8}$ mbar is preferably maintained during the entire transfer. The transfer chamber B can be isolated from the process modules via valves 14 and has a robotic arm 9 with grippers (not shown) for the substrates 1, 2 or the substrate stack 3.

The substrates 1, 2 are preadjusted first in a preadjusting system C. In the preferred embodiment of FIG. 1, a preadjusting system C is present for each of the two substrates 1, 2. The substrates 1, 2 are introduced in particular with an orientation in the high-vacuum environment that is not specifically known. A typical positional tolerance of substrates 1, 2 in the sluice A is in the range of a few millimeters to a few hundred micrometers. In particular, the rotation of the substrates 1, 2 around the Z-axis (vertical axis) can be +/−180° from the nominal value. The rotation or angular position is determined based on the periphery of the substrates, in particular edges in the case of quadratic substrates or flats or notches in the case of wafers. The preadjustment system C uses these peripheral geometry features in order to roughly preadjust the substrates 1, 2 to a positional accuracy of +/−100>μm along the X- and Y-axes, as well as +/−0.1° around the Z-axis (vertical axis).

After the preadjustment, the substrates 1, 2 are further transported through a transfer chamber B into the pretreatment station D. For the pretreatment station D, reference is made to PCT/EP2014/063303. The pretreatment station D is a module for plasma pretreatment of the substrate surfaces. The pretreatment implants particles under the substrate surfaces of the substrates 1, 2. In particular, in the case of the plasma pretreatment, the substrate surface of substrate 1 that has Si is amorphized in a thickness range of 1 to 20 nm by plasma treatment. Highly reactive molecules, which quickly form new bonds with molecules of the bonding partner (second substrate 2), remain on the surface. The amorphization reduces the necessary energy (force) in order to close microcavities. A maximum number of molecules can connect, whereby high proportions of contact surface and high bonding strengths result therefrom. In addition, the pretreatment produces the removal of organic contamination as well as oxides of metal or semiconductor materials. This is a desired effect in order to produce a conductive surface later.

After the substrates 1, 2 have been pretreated in each case in a pretreatment module D, they are transferred to an alignment module with integrated prefixing module F. On the way there, one of the two substrates 1, 2, is turned into a turning station E, since the substrates 1, 2 are loaded toward the top in the modules, preferably with the side that is to be bonded (substrate surfaces of substrates 1, 2). The process stations, in particular the pretreatment module D, are preferably designed for treatment of the substrate surfaces of substrates 1, 2 to be bonded from above.

For the alignment module F, preferably the upper substrate 1 is oriented downward with the substrate surface of substrate 1 to be bonded. The turning station E rotates the substrate 1 by 180° and thus prepares for the loading of the alignment module F. The transfer is done preferably via one of the transfer chambers B.

The alignment module F is shown in the embodiment according to FIG. 1 as a module in a unit with process-modules that are arranged in a linear manner. The alignment module F is equipped with a prefixing system for tacking. Tacking is thus carried out in the same module. In an alternative embodiment, the tacking can also take place in a separate module.

The prefixing module preferably has a striking system, in particular a pressure die 6, preferably a pressure pin arranged in the center. After alignment, the substrates 1, 2 make contact, and, by having a local, centrically arranged surface load introduced by the pressure die 6, at least this small partial surface bonds spontaneously and fixes the exact alignment of the substrates 1, 2 so that the latter no longer slip until bonding occurs in the bonding module G.

In an alternative embodiment, multiple local surface loads are introduced, for example by multiple pressure dies 6. As a result, multiple local partial surfaces bond spontaneously and fix the alignment at multiple points and thus better or with lower expenditure of force per point.

The alignment module F according to FIG. 2 preferably contains two openings with a valve 14 for loading the substrates 1, 2 and unloading the aligned and stuck substrate stack 3. As an alternative, the alignment module F contains only one opening with a valve 14 for loading and unloading. In the alignment module F, FIG. 2 shows an upper substrate receiving system 4 for receiving the upper substrate 1 on a receiving element (not shown). When receiving the substrate 1 in the substrate receiving system 4, only one receiving surface is in contact with a receiving side of the substrate 1. Opposite to the receiving side, the pretreated, in particular amorphized, substrate surface of the substrate 1 is arranged. The receiving surface of the receiving system 4 is matched in particular to a large extent to the dimensions and peripheral contours of the substrates 1 used.

In the alignment module F, FIG. 2 shows a lower substrate receiving system 8 for receiving the lower substrate 2 on a receiving element (not shown). When receiving the substrate 2 on the substrate receiving system 8, only the receiving surface comes into contact with the receiving side of the substrate 2. The pretreated, in particular amorphized, substrate surface 2o of the substrate 2 is arranged opposite to the receiving side. The receiving surface of the substrate receiving system 8 is matched in particular to a large extent to the dimensions and peripheral contours of the substrates 2 that are used.

The lower substrate receiving system 8 is arranged on an alignment unit 7, with which the lower substrate 2 can be aligned relative to the upper substrate 1 in the X-, Y- and rotational directions as well as in the angular position (wedge error compensation).

The upper substrate 1 is equipped with reference marks 1'. It can be designed in particular as a product substrate with structures that are part of a microelectronic, optical, micromechanical or microfluidic component. The lower substrate 2 is also equipped with reference marks 2'. It can be designed in particular as a product substrate with structures that are part of a microelectronic, optical, micromechanical or microfluidic component.

Preferred embodiments for fixing the substrates 1, 2 or wafers on the respective specimen holder are an electrostatic fixing of wafers under high vacuum or a mechanical fixing by clamping. In particular, the substrate receiving systems 4, 8 or the alignment module F are able—by means of the alignment unit 7—to align the two substrates 1, 2 in a plane-parallel manner and at a short distance by tilting around the X- and Y-axis for a wedge error compensation. This is carried out before the alignment along the X-Y-rotational axis or before making contact along the Z-axis. As an alternative, the wedge error compensation can also take place by actuators in the alignment unit 7. In general, the unit preferably has a system for a non-contact wedge error compensation between the substrates that are aligned in parallel, whereby reference is made in particular to the disclosure in WO2012/028166A1.

In addition, the substrate receiving system 4 has in particular a hole or a cutaway or indentation for the pressure die 6 in order to strike the substrate 1 locally with the pressure die 6.

Preferably, the substrate center (center M) is struck by the pressure die 6, so that mechanical stresses by different temperature input are avoided to a large extent in the upper substrate 1 and the lower substrate 2 based on the thermal expansion of the materials. As an alternative to this, multiple pressure dies are conceivable, however, in particular in the case of a pure room temperature process or in the case of the processing of materials with thermal expansion that is non-existent or very low.

In an alternative embodiment, the upper substrate holder 4 can be designed in a flexible manner to transfer the surface load of the pressure die 6 locally to the substrate pair.

In the embodiment according to FIG. 2, a pressure die 6 is specifically provided. With the latter, mechanical pressure is exerted on the surface of the substrate stack 3, in particular on the receiving side of the substrate 1.

The pressure die 6 is preferably designed as an actuator with the ability to run into contact with the receiving side of the upper substrate 1 in a controlled manner and to set a defined input of force. Preferably, this force is controlled by a control system, in particular pressure or current. Even more preferably, the force is regulated by a weighing cell in order to introduce an exact contact force that is measured in a reproducible and calibrated manner.

The pressure die 6 is preferably created in the shape of a pin. The tip of the pin can have different shapes. Thus, pointed tapering shapes, rounded, in particular spherical, shapes, or rectangular shapes are conceivable. The contact surface of the pressure dye can be designed curved or flat.

In this embodiment according to the invention, the prefixing is performed with an actuator in the center of the substrate. In this case, the resulting force c acts via the control of the actuator or the actuator system in the surface center of gravity of the contact surface between the substrates 1, 2. The unit preferably has sensors for monitoring force for a control of the pressurization.

In another embodiment, the pressure die 6 is designed as a pressure-elastic die (for example by an elastomer layer), which introduces especially uniform pressure or surface load into the substrate stack 3. The pressure die 6 can preferably be designed round with a die pressure surface of between 0.5 mm$^2$ and 8,000 mm$^2$, preferably between 0.5 mm$^2$ and 2,000 mm$^2$, and more preferably between 5 mm$^2$ and 500 mm$^2$.

In the prefixing, an equivalent pressure for spontaneous bonds in partial surfaces is introduced by local application of force in order to prefix (to stick or to "tack") the substrates 1, 2. The substrates 1, 2 are locally prebonded. On the partial surfaces, preferably a covalent bond is created that is strong enough to transfer the stuck substrate pair 3 into a bond chamber G for pressurization over the entire surface for bonding and optional heating. The alignment module F must thus be designed only for the resulting force of the partial surfaces.

The upper substrate receiving system 4 can be embodied in a transparent manner or have additional recesses or indentations for position-detecting means 5. If the upper substrate receiving system 4 is made transparent, certain or all components are manufactured from UV- and/or IR-transparent materials. The optical transparency of these materials is in particular greater than 0%, preferably greater than 20%, more preferably greater than 50%, most preferably greater than 80%, and with utmost preference greater than 95%.

The upper substrate receiving system 4 can, moreover, contain an actuating element for a controlled Z movement. On the one hand, in order to load the substrates 1, 2 with the robotic arm 9 and then to set an optimal distance for adjustment. On the other hand, in order to bring into contact the substrates 1, 2 after alignment is completed. In an alternative embodiment, the Z-movement can be embodied by the alignment unit 7.

The position-detecting means 5 can comprise in particular microscopes for detection of the position of the reference marks 1', 2' relative to the X- and Y-axis at at least two points. As an alternative, the position-detecting means 5 can be arranged under the substrate pair 3 as part of the alignment unit 7 or in addition to the alignment unit 7. In another embodiment, the position-detecting means 5, in addition to the substrates, are arranged approximately in the plane of the contact surface of the upper substrate 1 and the lower substrate 2. This embodiment makes possible the detection of the position of substrates 1, 2 via the detection of the edges.

The alignment unit 7 of FIG. 2 makes it possible to convert the signals of the position-detecting means 5 into adjustment movements for the lower substrate 2. Corresponding to the substrate receiving system 4 for the upper substrate 1, it can be embodied as an electrostatic-receiving system (chuck) under high vacuum or as a mechanical receiving system. In the case of the lower substrate receiving system 8, moreover, the pure center of gravity can also be sufficient, in another embodiment, to produce alignment and contact.

The alignment unit 7 has at least three movement axes: X-, Y- and a rotation around the Z-axis. Optionally, in another embodiment, a Z-axis can also be part of the alignment unit 7 with the function as described in the upper substrate receiving system 4. Further, a controlled tilting option around the X- and Y-axis can be provided in order to align the substrates 1, 2 in a plane-parallel manner before the adjustment process (wedge error compensation).

According to an advantageous embodiment, the position-detecting means 5 ensure the exact alignment of the substrates 1, 2 by detecting the relative positions and relaying them to the control system. This produces an alignment of the substrates 1, 2 to one another. The alignment is done manually or preferably automatically with an inaccuracy (misalignment) of less than 100 μm, preferably less than 10 μm, even more preferably less than 1 μm, with utmost preference less than 100 nm, and most preferably less than 10 nm.

Below, a sequence of an alignment and prefixing (tacking) based on the embodiment with pressure dies is described:

1) Opening of the loading valve 14,
2) Transfer of the first substrate 1 to the substrate receiving system 4 and fixing the first substrate 1 on the first substrate receiving system 4,
3) Transfer of the second substrate 2 to the second substrate receiving system 8 and fixing of the second substrate 2 to the second substrate receiving system 8,
4) Parallel alignment of the substrates 1, 2 via actuators in the alignment unit 7,
5) Setting a distance (adjustment gap) between the substrates 1, 2. The adjustment gap is in particular less than 100 μm, preferably less than 50 μm, and even more preferably less than 30 μm.
6) Alignment of the substrates 1, 2 via actuators in the alignment unit 7 by means of the positional detection with the position-detecting means 5 based on the reference marks 1', 2'; the second substrate 2 is preferably aligned relative to the first substrate 1. The reference marks 1', 2' are positioned overtop or are moved into preset relative positions,
7) Full-surface contact of the substrate surfaces that are to be bonded of the substrates 1, 2 with low contact force; in particular, the contact force lies between 0.1 N and 500 N, preferably between 0.5 N and 100 N, more preferably between 1 N and 50 N, and most preferably between 1 N and 10 N,
8) Imposing of force by the pressure die 6 on an in particular centric partial surface with a diameter of between 1 and 100 mm, preferably between 1 and 50 mm, more preferably between 3 and 20 mm; in particular, the force lies between 0.1 N and 5 kN, preferably between 0.5 N and 1 kN, more preferably between 1 N and 500 N, and most preferably between 10 N and 50 N; the local high pressure produces local covalent bonds and fixes the substrates 1, 2 in contact relative to one another (forming of the aligned substrate stack 3),
9) Removing the substrate stack 3 from the upper substrate holder 4,
10) Unloading the substrate stack 3 from the lower substrate holder 8 (for example via loading pins) with the robotic arm 9,
11) Transfer of the substrate stack 3 via the valve 14 to the bonding station G and bonding of the substrate stack 3.

FIG. 3*a* shows an overview of the second substrate 2 of the substrate stack 3, whereby a local surface 15 of the pressurization by the pressure die 6 performed on the substrate stack 3 after the alignment can be seen. This surface corresponds to a prefixed (tacked) zone 15 in the substrate stack 3.

The transfer of the substrate stack 3 between the adjusting system F with prefixing and bonding station G is carried out again via a transfer chamber B. The bonding station G according to FIG. 2 makes it possible to convert the partial-surface prefixing into a full-surface bond. In this case, in particular a high and uniform surface load is applied. Preferably, the force lies between 0.5 and 500 kN, preferably between 0.5 and 250 kN, more preferably between 0.5 and 200 kN, and most preferably between 1 and 100 kN. In addition, the temperature can be increased. In this case, the bonding temperature preferably lies between 18° C. and 1,100° C., preferably between 18° C. and 450° C., more preferably between 18° C. and 200° C., and most preferably at room temperature. The low temperature, despite very high bonding strength, is achieved by the effect of the pretreatment and seen as an advantage. CMOS circuits are not to be heated above 450° C., preferably not above 200° C. Special applications, such as, for example, the bonding of two semiconductor materials with very different thermal expansion (for example, Si with GaAs), are carried out preferably at low temperatures, preferably room temperature, in order to avoid subsequent mechanical stresses and distortions.

A pressure die 11 of the bonding station G is connected to a force actuator 12 and introduces a uniform surface load into the substrate stack 3. For uniform distribution of the surface load, ductile (deformable) layers can be embedded, such as, for example, more flexible graphite, rubber and/or silicone matting.

Preferred force ranges of the force actuator 12 lie between 0.5 and 500 kN, preferably between 0.5 and 250 kN, more preferably between 0.5 and 200 kN, and most preferably between 1 and 100 kN. The force actuator 12 can be in particular a pneumatic cylinder, a hydraulic cylinder, an electrospindle drive, or a knee lever drive (not shown). Advantageous embodiments contain a measuring means for regulating the force, in particular in order to increase the latter in a programmed manner, to keep it constant, and later to bring it back down. The unit preferably has sensors for monitoring force.

The prefixed substrate stack 3 is delivered to the substrate receptacle 13, in particular via loading pins (not shown). In the holding device, the substrate receptacle 13 preferably has a lifting mechanism with loading pins in order to accommodate and to lay down a substrate stack 3 on the holding device or to lift a laid-down substrate stack 3 away from the holding device. In this case, the substrate stack 3 is raised using pins located in the specimen holder so that a robotic gripper (paddle), designed in particular as a robotic arm, can move below or to the side of the substrate stack and removes the latter with a, for example, forward movement of the pins. The substrate receptacle 13 can be made purely by the action of gravity. In an advantageous embodiment, the wafer stack 3 is fixed by an electrostatic fixing to the substrate receptacle 13. This electrostatic fixing can ensure that at the end of the bonding process, when the contact force is removed, the bonded substrate stack 3 remains on the preferred lower substrate receptacle 13. Optionally, the substrate receptacle 13 has a heating system (not shown) or a heating and/or cooling system.

Below, a preferred sequence for the final bonding step in the bonding station G is described:

1) Transfer of the prefixed substrate stack 3 via the valve 14 to the lower substrate receptacle 13, in particular via the loading pins,
2) Fixing the substrate stack 3 on the substrate receptacle 13, in particular via an electrostatic holding device,
3) Introducing a bonding force via the force actuator 12 and the pressure die 11,
4) Optional: heating by an in particular symmetrical and double-sided heating system,
5) Maintaining the bonding force and optionally the temperature (all microcavities between the substrate surfaces of the substrates 1, 2, by which a more covalent bond over the entire substrate surface is formed, are closed by the uniform force that is introduced),
6) Optional cooling,
7) Removing the bonding force,
8) Unloading the substrate stack 3 from the substrate receptacle 13, in particular with loading pins, p1 9) Transfer of the bonded substrate stack 3 by the valve 14 and via the robotic arm 9 (transfer chamber B)

In an embodiment that is preferred according to the invention, the valve 14 or sluice gate is a gate valve, in particular an ultra-high vacuum gate valve, for transfer of the substrates 1, 2 or the substrate stack 3.

The alignment accuracy of the bonded substrates after the prefixing as well as after the bonding is preferably less than 100 μm, preferably less than 10 μm, more preferably less than 5 μm, most preferably less than 2 μm, with utmost preference less than 1 μm, and even more preferably <100 nm.

The target bonding strength for the final full-surface bond is preferably greater than $1 \text{ J/m}^2$, preferably greater than 1.5 $\text{J/m}^2$, and more preferably greater than $2 \text{ J/m}^2$.

The area that is actually to be bonded does not always correspond to the entire surface of the substrates 1, 2. As shown in FIGS. 3*b* and 4, the bonding surfaces depend on the creation of the substrates 1, 2. In the embodiment according to FIG. 3*b*, sealing frames form a bonding surface 17 around each structure or assembly (device) of the substrate stack 3. This method is used for MEMS. FIG. 3*b* shows the bonded zone 16.

FIG. 4 shows a cross-sectional view according to the line of intersection H-H of FIG. 3*a*. The cross-sectional view of the bonded substrate stack 3 according to FIG. 4 shows in particular the bonded zones 16 (sealing frames), the actual bonding surfaces 17, structures 18 of the product substrates 1, 2 (devices), and a non-bonded interstructural space 19.

Especially advantageous bonding processes for this invention are:
- Hermetically-sealed high-vacuum bonds (permanently sealing a high vacuum in a cavity of the substrate)
- Electrically-conductive bond connections
- Optically transparent bond connections In the case of three-dimensional (3D) integration of microelectronics, bonds over the entire surface are preferred, in particular between silicon dioxide ($SiO_2$) surfaces, or else simultaneously with copper (Cu) and $SiO_2$ in the case of so-called hybrid bonds. In this embodiment, the bonding surface corresponds to the entire substrate surface.

FIG. 5*a* shows an overview of the lower product substrate 2 of a substrate stack 3, whereby the local surface of the pressurization, exerted on the substrate stack 3 after the alignment, by pressure die can be seen. This surface corresponds to the prebonded (tacked) zone 15 on the substrate stack.

FIG. 5*b* shows the actual bonding surface 17 that results after the bonding over the entire surface.

LIST OF REFERENCE SYMBOLS

1, 2 Substrates
1', 2' Reference marks
3 Substrate stack
4 First substrate receptacle
5 Position-detecting means
6 Pressure die
7 Alignment unit
8 Second substrate receptacle
9 Robotic arm
11 Pressure die
12 Force actuator
13 Substrate receptacle
14 (Loading) valve
15 Prefixed (tacked) zone
16 Bonded zone
17 Bonding surface
18 Structures
19 Interstructural space
20 Working space
a Transfer step without significantly changing the vacuum
b Transfer of or according to ambient pressure
c Force vector
k High-vacuum environment
A Sluice
B Transfer chamber
C Preadjustment system
D Pretreatment station
E Turning station
F Alignment module with prefixing system
G Bonding station
M Center of the substrate or the substrate stack Having described the invention, the following is claimed:

1. A device for processing first and second substrates, each of the substrates having a respective substrate surface, the device comprising:
    at least one pretreatment system for pretreating the substrate surface of at least one of the first and second substrates at one or more surface areas of the substrate surface, thereby providing one or more pretreated surface areas,
    an alignment system for aligning the first and second substrates,
    a prefixing system downstream from the alignment system for contacting the respective substrate surfaces of the first and second substrates and prefixing the aligned first and second substrates at the one or more pretreated surface areas, the prefixing system comprising a laser configured to apply heat locally to the one or more pretreated surface areas, and
    a robotic arm configured to transport the prefixed first and second substrates.

2. The device according to claim 1, wherein the pretreated surface areas are amorphized.

3. The device according to claim 1, wherein said prefixing takes place in a separate prefixing module.

* * * * *